(12) United States Patent
Meineke et al.

(10) Patent No.: US 11,041,925 B2
(45) Date of Patent: Jun. 22, 2021

(54) DIRECT MEASUREMENT OF THE B0-OFF-RESONANCE FIELD DURING MAGNETIC RESONANCE FINGERPRINTING

(71) Applicant: KONINKLIJKE PHILIPS N.V., Eindhoven (NL)

(72) Inventors: Jan Jakob Meineke, Hamburg (DE); Thomas Erik Amthor, Hamburg (DE); Peter Koken, Hamburg (DE); Karsten Sommer, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 16/339,405

(22) PCT Filed: Sep. 22, 2017

(86) PCT No.: PCT/EP2017/073974
§ 371 (c)(1),
(2) Date: Apr. 4, 2019

(87) PCT Pub. No.: WO2018/065233
PCT Pub. Date: Apr. 12, 2018

(65) Prior Publication Data
US 2019/0242961 A1    Aug. 8, 2019

(30) Foreign Application Priority Data
Oct. 6, 2016  (EP) .................................... 16192638

(51) Int. Cl.
*G01R 33/44* (2006.01)
*G01R 33/24* (2006.01)
(Continued)

(52) U.S. Cl.
CPC ......... *G01R 33/443* (2013.01); *G01R 33/243* (2013.01); *G01R 33/246* (2013.01); *G01R 33/5608* (2013.01); *G01R 33/50* (2013.01)

(58) Field of Classification Search
CPC .. G01R 33/243; G01R 33/246; G01R 33/443; G01R 33/50; G01R 33/5608; G01R 33/448
See application file for complete search history.

(56) References Cited

U.S. PATENT DOCUMENTS

2012/0235678 A1   9/2012  Seiberlich et al.
2013/0265047 A1  10/2013  Griswold et al.
(Continued)

OTHER PUBLICATIONS

Jiang et al., "MR fingerprinting using fast imaging with steady state precession (FISP) with spiral readout" MRM vol. 74, p. 1621 (2015).
(Continued)

*Primary Examiner* — Rishi R Patel

(57) ABSTRACT

A processor controls an MRI system with pulse sequence commands to acquire magnetic resonance data according to a magnetic resonance fingerprinting protocol during multiple pulse repetitions. The pulse sequence commands control the magnetic resonance imaging system to cause gradient induced spin rephasing at least twice during each of the multiple pulse repetitions, and to acquire at least two magnetic resonance signals during each of the multiple pulse repetitions. Each of the at least two magnetic resonance signals is measured during a separate one of the gradient induced spin rephasing. The magnetic resonance data includes the at least two magnetic resonance signals acquired during each of the multiple pulse repetitions. The processor further at least partially calculates a B0-off-resonance map using the magnetic resonance data, and generates at least one magnetic resonance parametric map by comparing the magnetic resonance data with a magnetic resonance fingerprinting dictionary.

15 Claims, 3 Drawing Sheets

(51) Int. Cl.
*G01R 33/56* (2006.01)
*G01R 33/50* (2006.01)

(56) References Cited

U.S. PATENT DOCUMENTS

| | | | |
|---|---|---|---|
| 2013/0271132 A1 | 10/2013 | Griswold | |
| 2014/0232399 A1 | 8/2014 | Griswold et al. | |
| 2015/0301147 A1 | 10/2015 | Gulani et al. | |
| 2015/0323631 A1* | 11/2015 | Asslaender | G01R 33/50 324/309 |
| 2016/0103196 A1 | 4/2016 | Grodzki | |
| 2016/0109547 A1 | 4/2016 | Grodzki | |
| 2016/0131729 A1 | 5/2016 | Kang et al. | |
| 2016/0131732 A1* | 5/2016 | Pfeuffer | G01R 33/56563 324/322 |
| 2016/0349342 A1 | 12/2016 | Cohen | |
| 2017/0371010 A1* | 12/2017 | Shanbhag | A61B 5/055 |
| 2018/0011158 A1* | 1/2018 | Katscher | G01R 33/243 |
| 2018/0017646 A1* | 1/2018 | Feiweier | G01R 33/561 |
| 2020/0341080 A1* | 10/2020 | De Weerdt | G01R 33/543 |

OTHER PUBLICATIONS

Dan Ma et al: "Magnetic resonance fingerprinting",Nature, vol. 495, No. 7440, Mar. 13, 2013 (Mar. 13, 2013), pp. 187-192.

Voigt, Doessel and Katscher, "Quantitative Conductivity and Permittivity Imaging of the Human Brain Using Electric Properties Tomography" MRM 66, p. 456-466 (2011).

Wang and Liu, "Quantitative Susceptibility Mapping (QSM) Decoding MRI Data for a Tissue Magnetic Biomarker" MRM vol. 73, p. 82-101 (2015).

Haacke et al., Imaging Iron Stores in the Brain Using Magnetic Resonance Imaging, MRI vol. 23, p. 1-25 (2005).

Stephen F. Cauley et al. "Fast Group Matching for MR Fingerprinting Reconstruction", Magnetic Resonance in Med. 74: p. 523-528 (2015).

Eric Y. Pierre et al.,"Multiscale Reconstruction for MR Fingerprinting"; Magnetic Resonance in Med. 75: p. 2481-2492 (2016).

Christen et al "MR Vascular Fingerprinting: A New Approach to Compute Cerebral Blood Volume, Mean Vessel Radius, and . . . " Neuroimage, vol. 89, Dec. 7, 2013, p. 262-270.

Zhe Wang et al: "MRP denoising with compressed sensing and adaptive filtering".arxiv.org, Cornell University Library, 2010 Olin Library Cornell University Ithaca, NY 14853, Jan. 3, 2014 (Jan. 3, 2014), XP080000282, DOI: 10.1109/ISBI.2014.6868009.

Klaus Scheffler: "A Pictorial Description of Steady-States in Rapid Magnetic Resonance Imaging", Concepts in Magnetic Resonance, vol. 11, Jan. 1, 1999 (Jan. 1, 1999),pp. 291-304.

Matthias Weigel: "Extended phase graphs:Dephasing, RF pulses, and echoes—pure and simple". Journal of Magnetic Resonance Imaging,vol. 41, No. 2, Apr. 16, 2014 (Apr. 16, 2014),pp. 266-295.

Katshcer et al "Recent Progress and Future Challenges in MR Electric Properties Tomography" Computational and Mathematical Methods in Med. vol. 2013, ID 546562.

* cited by examiner

DIRECT MEASUREMENT OF THE B0-OFF-RESONANCE FIELD DURING MAGNETIC RESONANCE FINGERPRINTING

CROSS REFERENCE TO RELATED APPLICATIONS

This application is a U.S. national phase application of International Application No. PCT/EP2017/073974, filed on Sep. 22, 2017, which claims the benefit of EP Application Ser. No. 16/192,638.1 filed on Oct. 6, 2016 and is incorporated herein by reference.

FIELD OF THE INVENTION

The invention relates to magnetic resonance imaging, in particular to magnetic resonance fingerprinting techniques.

BACKGROUND OF THE INVENTION

Magnetic Resonance (MR) fingerprinting is a technique where a number of RF pulses often associated with appropriate gradient switching, distributed in time, are applied such that they cause signals from different materials or tissues to have a unique contribution to the measured MR signal. A dictionary of precalculated signal contributions from a large set or a fixed number of substances is compared to the measured MR signals within each single voxel. Furthermore, also the composition within each voxel can further be determined. For example if it is known that a voxel only contains gray matter, white matter, CSF, or fat the contribution from these three materials need only be considered to accurately determine the composition of the voxel. If a larger dictionary with higher resolution is used, MR fingerprinting can be used to determine different tissue parameters of a voxel (such as T1, T2, . . . ) simultaneously and quantitatively.

The magnetic resonance fingerprinting technique was introduced in the journal article Ma et al., "Magnetic Resonance Fingerprinting," Nature, Vol. 495, pp. 187 to 193, doi:10.1038/nature11971. The magnetic fingerprinting technique is also described in United States patent applications US 2013/0271132 A1 and US 2013/0265047 A1.

SUMMARY OF THE INVENTION

The invention provides for a magnetic resonance imaging system, a method, and a computer program product in the independent claims. Embodiments are given in the dependent claims.

In magnetic resonance imaging fingerprinting, various properties of a subject can be included in the dictionary. For example, the concentration of various compounds can be included. Other properties which affect the measured MR signals can also be included. For example the T1 time, T2 time, and other properties.

In magnetic resonance imaging, data is typically acquired when the magnetization is in transient state (opposed to conventional steady state imaging). MR fingerprinting relies on pattern recognition algorithms and large parameter data bases. MR fingerprinting is possible through the continuous variation of the acquisition parameters throughout data collection. Ma et al, 2013 describe (pseudo) random variation of parameters. However, also other variation of parameters is possible, e.g. variation by means of an analytical function. To this end MR fingerprinting uses multiple acquisition blocks, identified by a repetition time index.

When magnetic resonance imaging is performed, the B0 (or main magnetic field) is according to a simplistic analysis assumed to be uniform. However, non-uniformities in the B0 magnetic field can be caused by a variety of factors. One factor is the magnetic susceptibility of the subject. Various tissues types of tissues have different susceptibilities and thus can distort the B0 magnetic field. This deviation from the orientation of a uniform B0 magnetic field can be expressed in terms of an off-resonant term which modifies the B0 magnetic field to an effective magnetic field. The off-resonant term is referred to herein as the B0-off-resonance field or B0-off-resonance magnetic field.

The B0-off-resonance magnetic field may be useful for a variety of things such as precisely calculating chemical shifts within a voxel. Knowledge of the B0-off-resonance magnetic field may also be useful for calculating various electrical properties of the subject. For example the B0-off-resonance magnetic field (also referred to as the off-resonance field or f herein) may be used to calculate the spatially dependent conductivity and/or permittivity of a subject using a technique called MR electric properties tomography. A review of these techniques can be found in the article Voigt et. al. "Quantitative Conductivity and Permittivity Imaging of the Human Brian Using Electric Properties Tomography," Magnetic Resonance in Medicine 66: 456-466 (2011), pp. 456-466 (referred to as Voigt et. al. herein). Another review of these techniques is contained in the article Katscher et. al. "Recent Progress and Future Challenges in MR Electric Properties Tomography," Computational and Mathematical Methods in Medicine, Volume 2013, Article ID 546562, 11 pages, http://dx.doi.org/10.1155/2013/546562 (referred to as Katscher et. al. herein).

Embodiments of the invention may provide for an improved means of determining the B0-off-resonance magnetic field during MR fingerprinting. Instead of encoding the B0-off-resonance magnetic field in the dictionary, the B0-off-resonance magnetic field is measured directly. The pulse sequence commands are configured to acquire the magnetic resonance data for the MR fingerprinting during multiple pulse repetitions. The gradients of the pulse repetition are configured such that there are at least two occurrences of gradient induced spin rephasing. When the spins rephase a magnetic resonance signal is emitted. This is also commonly referred to as an "echo." When there are just two magnetic resonance signals then, as described below herein, the inner-product of the signal can be used to directly calculate the B0-off-resonance magnetic field. Once the B0-off-resonance magnetic field is known, it can be used for example Electric Properties Tomography or calculate other quantities, such as precise chemical shifts, to improve the MR fingerprinting.

In one aspect the invention provides for a magnetic resonance imaging system for acquiring magnetic resonance data from a subject within an imaging zone. The magnetic resonance imaging system comprises a gradient magnetic field generating system configured for generating a gradient magnetic field within the imaging zone. In some examples, the magnetic field generating system may comprise a gradient coil power supply and one or more magnetic field gradient coils.

The magnetic resonance imaging system further comprises a radio-frequency system configured for acquiring the magnetic resonance data. Acquiring the magnetic resonance data may include imaging radio-frequency energy for manipulating the orientation of spins and/or the recording of radio-frequency signals which may also be referred to as magnetic resonance signals herein. The radio-frequency system may comprise an antenna or coil that is connected to a transmitter, receiver or transceiver. The magnetic resonance imaging system further comprises a memory for storing machine-executable instructions and for storing pulse sequence commands. The pulse sequence commands as used herein encompass commands or data which may be converted into commands for controlling the magnetic resonance imaging system to acquire the magnetic resonance data.

The pulse sequence commands are configured for controlling the magnetic resonance imaging system to acquire the magnetic resonance data according to a magnetic resonance imaging fingerprinting protocol. The pulse sequence commands are configured for controlling the magnetic resonance imaging system to acquire the magnetic resonance data during multiple pulse repetitions. A portion of the magnetic resonance data is acquired during each of the multiple pulse repetitions. The pulse sequence commands are configured for controlling the magnetic resonance imaging system to cause gradient-induced spin rephasing at least twice during the multiple pulse repetitions using the gradient magnetic field generating system. The gradient-induced spin rephasing may for example be achieved by a magnetic field gradient pulse that is applied and reverses the spatial variation of phase of the transverse magnetization which for example can be caused by a dephasing gradient. The gradient-induced spin rephasing may for example be referred to as a gradient echo.

The pulse sequence commands are further configured for controlling the magnetic resonance imaging system to acquire at least two magnetic resonance signals. This is done for each of the multiple pulse repetitions. Each of the at least two magnetic resonance signals is measured during a separate one of the gradient-induced spin rephasings. The magnetic resonance data comprises the at least two magnetic resonance signals acquired during each of the multiple pulse repetitions.

The magnetic resonance imaging system further comprises a processor for controlling the magnetic resonance imaging system. Execution of the machine-executable instructions causes the processor to control the magnetic resonance imaging system with the pulse sequence commands to acquire the magnetic resonance data. Execution of the machine-executable instructions further causes the processor to calculate a B0-off-resonance map using the magnetic resonance data. The B0-off-resonance map is descriptive of a B0-off-resonance magnetic field of the magnetic resonance imaging system when the subject is within the imaging zone. The B0-off-resonance map is at least partially calculated using the at least two magnetic resonance signals measured during a single pulse repetition. In magnetic resonance fingerprinting the B0-off-resonance value for a particular voxel may be encoded into the magnetic resonance fingerprinting dictionary. The Nature article by Ma et al. introduces the basic idea of magnetic resonance fingerprinting and terminology which is used to describe this technique such as the dictionary, which is referred to herein as a "precalculated magnetic resonance fingerprinting dictionary," a "magnetic resonance fingerprinting dictionary," and a "dictionary."

In the present embodiment, the B0-off-resonance magnetic field is measured directly by comparing the multiple magnetic resonance signals within a single pulse repetition. Within each single pulse repetition a portion of k-space is sampled for each of the at least two MR images with different echo times. The at least two images are then reconstructed after all data have been acquired. Finally, the B0-off-resonance map is calculated voxel-wise based on these at least two images.

Execution of the machine-executable instructions further cause the processor to generate at least one magnetic resonance parametric map by comparing the magnetic resonance data within a magnetic resonance fingerprinting dictionary. A magnetic resonance parametric map as described herein encompasses a two or three-dimensional mapping of either a concentration of the subject or an intrinsic property of the subject. For instance various values which may be measured in magnetic resonance such as the T1 time, the T2 time, the M0 map or other values may be represented in the magnetic resonance parametric map.

In magnetic resonance fingerprinting, magnetic resonance data is acquired for a variety of flip angles and other magnetic resonance parameters which can be varied within a pulse repetition. The data acquired in a pulse repetition represents a portion of k-space. Multiple pulse repetitions may be combined and then reconstructed into an image. The magnetic resonance fingerprinting is then done by looking at the same voxel within a sequence of these images. The magnetic resonance fingerprinting dictionary comprises an expected value for the value of a voxel for a given set of intrinsic properties such as the T1 value, the T2 value or other properties such as the concentration of water or fat. The value for this voxel within the series of images is then compared to the expected values of the magnetic resonance fingerprinting dictionary. By choosing the dictionary entry which matches the closest or a combination of several different entries the parametric values for a particular voxel may be inferred.

This embodiment may be beneficial because it obtains not only magnetic resonance fingerprinting information but it also contains a directly measured B0-off-resonance map. This may have the benefit of avoiding to calculate the B0-off-resonance map using the magnetic resonance fingerprinting dictionary. This may result in more accurate determination of the B0-off-resonance magnetic field.

In another embodiment the B0-off-resonance map is calculated at least partially using a complex dot-product of two of the at least two magnetic resonance signals measured during a single pulse repetition. This embodiment may have the means of directly calculating the B0-off-resonance magnetic field.

In an alternative, when more than two magnetic resonance measured signals are measured during a single pulse repetition there may be alternate ways of calculating the B0-off-resonance magnetic field. For example the complex dot-product formulation can be calculated for all combinations of two of the magnetic resonance signals. Then various weightings or averages may be used to obtain a single value. This may have the benefit of reducing the amount of noise or variation in the B0-off-resonance map.

In another embodiment execution of the machine-executable instructions further cause the processor to calculate at least one magnetic resonance parametric map using component matching. Component matching as used herein is where the contents of two or more variables of the magnetic resonance fingerprinting dictionary contribute to the magnetic resonance signal. For example within a brain, portions of the brain may have signals within a voxel that come from both white and gray matter. In another example a voxel may contain both muscle and fatty tissue. Component matching as used herein is the determination of how much a particular component contributes to the magnetic resonance signal within a voxel. The component matching is performed at least partially by weighting at least a portion of the magnetic resonance fingerprinting dictionary with chemical shift data. For example fat and water tissue may have different effects on the B0 magnetic field. This may result in a different B0-off-resonance map depending upon how much of each tissue type contributes. The chemical shift data is calculated at least partially using the B0-off-resonance map.

In some examples, the component matching may represent an iterative process. For example the water and fat composition of a collection of voxels next to each other may have an effect on the B0-off-resonance map. Using an assumption about the fat and water composition of voxels the B0-off-resonance map could be used to calculate an initial chemical shift data. After performing a first loop of the component matching this model could be updated with the calculated content of fat and water within particular voxels and then run again calculated using the new chemical shift data. This could for example be repeated until the answer converges to a solution.

In another embodiment execution of the machine-executable instructions further cause the processor to calculate a quantitative susceptibility map using at least partially the B0-off-resonance map. Once the B0-off-resonance map is known a technique known as quantitative susceptibility mapping or QSM may be used to calculate a quantitative susceptibility map. QSM analysis techniques are reviewed in the journal article Wang et. al. "Quantitative Susceptibility Mapping (QSM): Decoding MRI Data for a Tissue Magnetic Biomarker," Magnetic Resonance in Medicine, 73:82-101 (2015), pp. 82-101 (herein referred to as Wang et. al.

In another embodiment the quantitative susceptibility map is at least partially calculated by solving an inverse problem descriptive of a magnetic susceptibility of the subject. The solution of such an inverse problem is for example described in Wang et al.

In another embodiment execution of the machine-executable instructions further cause the processor to calculate an RF transmit/receive phase map using the magnetic resonance data. The RF transmit/receive phase map is descriptive of the spatially dependent RF transmit/receive phase.

This embodiment may be beneficial because the RF transmit/receive phase map may be useful in calculating various electric properties of the subject in either two or three dimensions. For example the review article (note to self: insert reference by Catcher et al here) describes how the RF transmit/receive phase map may be used for calculating various magnetic resonance electrical properties.

In another embodiment execution of the instructions further cause the processor to calculate magnetic resonance electric properties tomographic data using at least partially the RF transmit/receive phase map. Magnetic resonance electric properties tomography data may include such properties as conductivity and permittivity distributions within a subject either two-dimensionally and/or three-dimensionally. The method of calculating such values from the RF transmit/receive phase map is for example detailed in the review article by Katscher et. al.

In another embodiment the magnetic resonance fingerprinting dictionary is at least partially a function of the transmit B1 magnetic field magnitude. The at least one magnetic resonance parametric map comprises a transmit B1 magnetic field magnitude map. The magnetic resonance electric properties tomography data is calculated at least partially using the transmit B1 magnetic field magnitude map. This embodiment may be beneficial because a knowledge of the transmit B1 magnetic field may make the magnetic resonance electric properties tomography data calculations more accurate.

In another embodiment, execution of the machine-executable instructions further cause the processor to calculate a direct T2-star map at least partially using at least two magnetic resonance signals measured during a single pulse repetition. The direct T2-star map is a T2-star map which is calculated directly using amplitudes of the at least two magnetic resonance signals measured during a single pulse repetition. The term 'direct' before the direct T2-star map is intended as a label to differentiate it from T2-star maps or measurements which are made using the magnetic resonance fingerprinting dictionary. T2-star measurements or maps made using the magnetic resonance fingerprinting dictionary are referred to as encoded T2-star maps or measurements.

This embodiment may be beneficial because by examining amplitudes of the at least two magnetic resonance signals within a single pulse repetition the T2-star values can be inferred or calculated directly.

In another embodiment, the magnetic resonance fingerprinting dictionary is at least partially a function of T2. The at least one magnetic resonance parametric map comprises a T2 map. Execution of the machine-executable instructions further causes the processor to calculate at least partially a T2-prime map from the T2 map and the direct T2-star map. This may have the benefit that the T2-prime map may be useful for such values as predicting the iron content spatially within a subject. The T2' value can be calculated using the formula: $1/T2'=1/T2-1/T2\text{-star}$.

In another embodiment the magnetic resonance fingerprinting dictionary is at least partially a function of T2-star. The at least one magnetic resonance parametric map comprises an encoded T2-star map. Execution of the machine-executable instructions further cause the processor to calculate an extended T2-star map using the direct T2-star map and the encoded T2-star map. The extended T2-star map is calculated by taking values from within a first predetermined range from the direct T2-star map and from within a second predetermined range from the encoded T2-star map. There may be several benefits in determining the T2-star map in this manner.

For instance, when the direct T2-star map is measured the range of T2-star values which can be measured is determined by the temporal distance between the two magnetic resonance signals. When making a direct T2-star map it may be beneficial to choose the time difference such that the decrease in amplitude of the at least two magnetic resonance signals is large in comparison to the noise. In other words, when the direct T2-star map is calculated there is a range for which the T2-star map values are accurate. The encoding of some T2-star values in the magnetic resonance fingerprinting dictionary can therefore extend the range for which the extended T2-star map is accurate. Some of the values are taken from the direct T2-star map and other values are taken from the encoded T2-star map.

In another embodiment, the magnetic resonance fingerprinting dictionary is calculated by modeling each of the predetermined substances using an extended phase graph formulation. The extended phase graph formulation is for example described in Weigel, M. (2015), Extended phase graphs: Dephasing, RF pulses, and echoes—pure and simple. J. Magn. Reson. Imaging, 41: 266-295. doi: 10.1002/jmri.24619 and is also described in Scheffler, K. (1999), A pictorial description of steady-states in rapid magnetic resonance imaging. Concepts Magn. Reson., 11: 291-304. doi: 10.1002/(SICI)1099-0534(1999)11:5<291:: AID-CMR2>3.0.CO;2-J.

In another aspect, the invention provides for a method of operating a magnetic resonance imaging system for acquiring magnetic resonance data from a subject within an imaging zone. The magnetic resonance imaging system comprises a gradient magnetic field generation system configured for generating a gradient magnetic field within the imaging zone. The magnetic resonance imaging system further comprises a radio-frequency system configured for acquiring the magnetic resonance data. The method comprises controlling the magnetic resonance imaging system with pulse sequence commands to acquire the magnetic resonance data. The pulse sequence commands are configured for controlling the magnetic resonance imaging system to acquire the magnetic resonance data according to a magnetic resonance fingerprinting protocol. The pulse sequence commands are configured for controlling the magnetic resonance imaging system to acquire the magnetic resonance data during multiple pulse repetitions. The pulse sequence commands are configured for controlling the magnetic resonance imaging system to cause gradient-induced spin rephasing at least twice during each of the multiple pulse repetitions using the gradient magnetic field generating system. The pulse sequence commands are configured for controlling the magnetic resonance imaging system to acquire at least two magnetic resonance signals during each of the multiple pulse repetitions. Each of the at least two magnetic resonance signals is measured during a separate one of the gradient-induced spin rephasings. The magnetic resonance data comprises the at least two magnetic resonance signals acquired during each of the multiple pulse repetitions.

The method further comprises calculating a B0-off-resonance map using the magnetic resonance data. The B0-off-resonance map is descriptive of a B0-off-resonance magnetic field of the magnetic resonance imaging system when the subject is within the imaging zone. The B0-off-resonance map is at least partially calculated using at least two magnetic resonance signals measured during a single pulse repetition. The method further comprises generating at least one magnetic resonance parametric map by comparing the magnetic resonance data with a magnetic resonance fingerprinting dictionary.

In another embodiment the B0-off-resonance map is calculated at least partially using a complex-dot-product of two of the at least two magnetic resonance signals measured during a single pulse repetition.

In another aspect, the invention provides for a computer program product comprising machine-executable instructions for execution by a processor controlling the magnetic resonance imaging system for acquiring magnetic resonance data from a subject within an imaging zone. The magnetic resonance imaging system comprises a gradient magnetic field generating system configured for generating a gradient magnetic field within the imaging zone. The magnetic resonance imaging system further comprises a radio-frequency system configured for acquiring the magnetic resonance data.

Execution of the machine-executable instructions causes the processor to control the magnetic resonance imaging system with pulse sequence commands to acquire the magnetic resonance data. The pulse sequence commands are configured for controlling the magnetic resonance imaging system to acquire the magnetic resonance data according to a magnetic resonance fingerprinting protocol. The pulse sequence commands are configured for controlling the magnetic resonance imaging system to acquire the magnetic resonance data during multiple pulse repetitions. The pulse sequence commands are configured for controlling the magnetic resonance imaging system to cause gradient-induced spin rephasing at least twice during each of the multiple pulse repetitions using the gradient magnetic field generating system. The pulse sequence commands are configured for controlling the magnetic resonance imaging system to acquire at least two magnetic resonance signals during each of the multiple pulse repetitions. Each of the at least two magnetic resonance signals is measured during a separate one of the gradient-induced spin rephasing. The magnetic resonance data comprises the at least two magnetic resonance signals acquired during each of the multiple pulse repetitions.

Execution of the machine-executable instructions further causes the processor to calculate a B0-off-resonance map using the magnetic resonance data. The B0-off-resonance map is descriptive of a B0-off-resonance magnetic field of the magnetic resonance imaging system when the subject is within the imaging zone. The B0-off-resonance map is at least partially calculated using at least two magnetic resonance signals measured during a single pulse repetition. Execution of the machine-executable instructions further cause the processor to generate at least one magnetic resonance parametric map by comparing the magnetic resonance data with a magnetic resonance fingerprinting dictionary.

In another embodiment the B0-off-resonance map is calculated at least partially using a complex-dot-product of two of the at least two magnetic resonance signals measured during a single pulse repetition.

It is understood that one or more of the aforementioned embodiments of the invention may be combined as long as the combined embodiments are not mutually exclusive.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example a data may be retrieved over a modem, over the internet, or over a local area network. Computer executable code embodied on a computer readable medium may be transmitted using any appropriate medium, including but not limited to wireless, wire line, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a processor. 'Computer storage' or 'storage' is a further example of a computer-readable storage medium. Computer storage may be any volatile or non-volatile computer-readable storage medium.

A 'processor' as used herein encompasses an electronic component which is able to execute a program or machine executable instruction or computer executable code. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. The computer executable code may be executed by multiple processors that may be within the same computing device or which may even be distributed across multiple computing devices.

Computer executable code may comprise machine executable instructions or a program which causes a processor to perform an aspect of the present invention. Computer executable code for carrying out operations for aspects of the present invention may be written in any combination of one or more programming languages, including an object oriented programming language such as Java, Smalltalk, C++ or the like and conventional procedural programming languages, such as the C programming language or similar programming languages and compiled into machine executable instructions. In some instances the computer executable code may be in the form of a high level language or in a pre-compiled form and be used in conjunction with an interpreter which generates the machine executable instructions on the fly.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It is understood that each block or a portion of the blocks of the flowchart, illustrations, and/or block diagrams, can be implemented by computer program instructions in form of computer executable code when applicable. It is further understood that, when not mutually exclusive, combinations of blocks in different flowcharts, illustrations, and/or block diagrams may be combined. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, pedals, wired glove, remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, bluetooth connection, wireless local area network connection, TCP/IP connection, ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bi-stable display, Electronic paper, Vector display, Flat panel display, Vacuum fluorescent display (VF), Light-emitting diode (LED) display, Electroluminescent display (ELD), Plasma display panel (PDP), Liquid crystal display (LCD), Organic light-emitting diode display (OLED), a projector, and Head-mounted display.

Magnetic Resonance (MR) data is defined herein as being the recorded measurements of radio frequency signals emitted by atomic spins using the antenna of a magnetic resonance apparatus during a magnetic resonance imaging scan. Magnetic resonance data is an example of medical imaging data. A Magnetic Resonance (MR) image is defined herein as being the reconstructed two or three dimensional visualization of anatomic data contained within the magnetic resonance imaging data.

BRIEF DESCRIPTION OF THE DRAWINGS

In the following preferred embodiments of the invention will be described, by way of example only, and with reference to the drawings in which.

DETAILED DESCRIPTION OF THE EMBODIMENTS

Like numbered elements in these Figs are either equivalent elements or perform the same function. Elements which have been discussed previously will not necessarily be discussed in later Figs if the function is equivalent.

Figure 1:
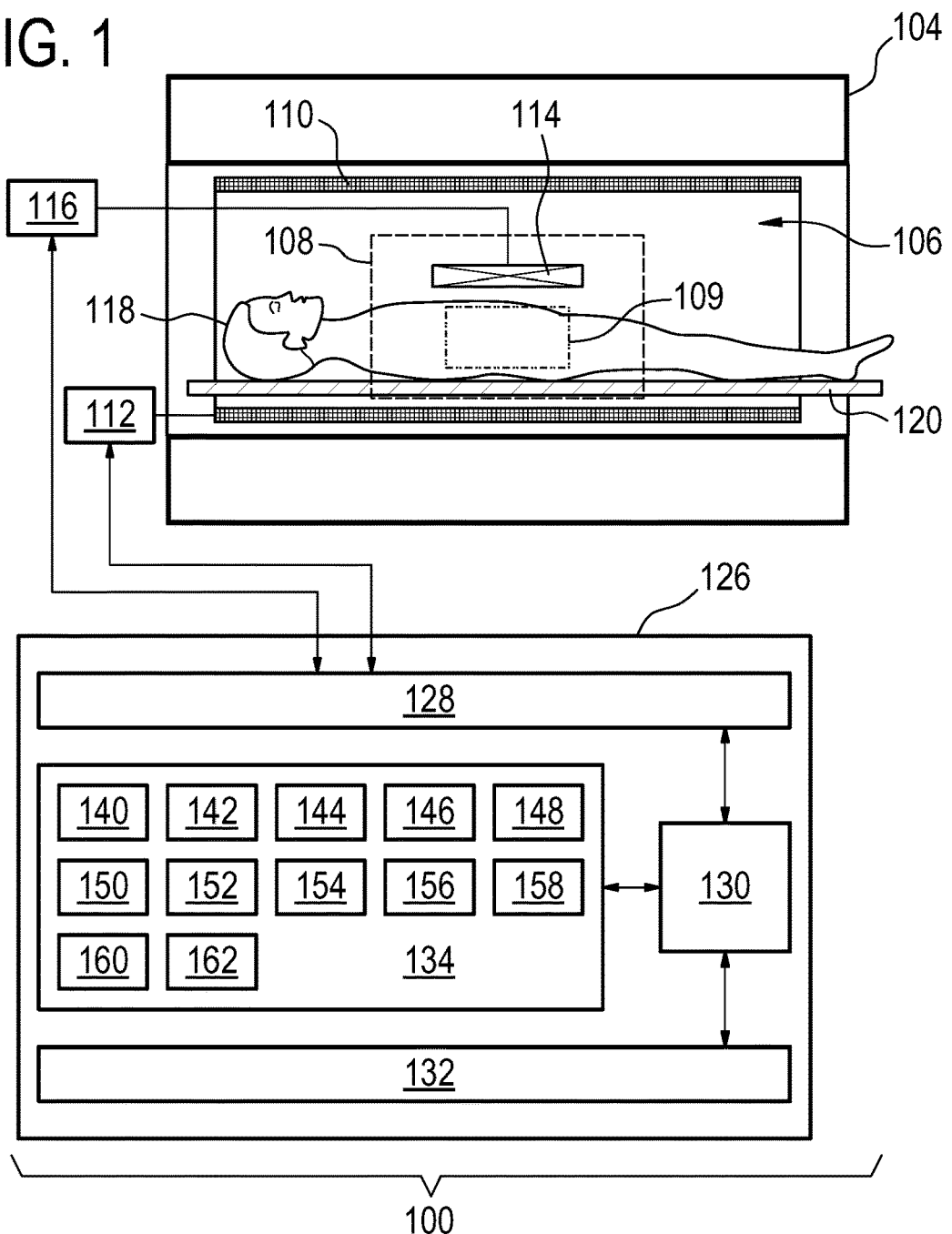
FIG. 1 illustrates and example of a magnetic resonance imaging system.

FIG. 1 shows an example of a magnetic resonance imaging system 100 with a magnet 104. The magnet 104 is a superconducting cylindrical type magnet with a bore 106 through it. The use of different types of magnets is also possible; for instance it is also possible to use both a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy. An open magnet has two magnet sections, one above the other with a space in-between that is large enough to receive a subject: the arrangement of the two sections area similar to that of a Helmholtz coil. Open magnets are popular, because the subject is less confined. Inside the cryostat of the cylindrical magnet there is a collection of superconducting coils. Within the bore 106 of the cylindrical magnet 104 there is an imaging zone 108 where the magnetic field is strong and uniform enough to perform magnetic resonance imaging. A region of interest 109 is shown within the imaging zone 108. A subject 118 is shown as being supported by a subject support 120 such that at least a portion of the subject 118 is within the imaging zone 108 and the region of interest 109.

Within the bore 106 of the magnet there is also a set of magnetic field gradient coils 110 which is used for acquisition of magnetic resonance data to spatially encode magnetic spins within the imaging zone 108 of the magnet 104. The magnetic field gradient coils 110 connected to a magnetic field gradient coil power supply 112. The magnetic field gradient coils 110 are intended to be representative. Typically magnetic field gradient coils 110 contain three separate sets of coils for spatially encoding in three orthogonal spatial directions. A magnetic field gradient power supply supplies current to the magnetic field gradient coils. The current supplied to the magnetic field gradient coils 110 is controlled as a function of time and may be ramped or pulsed.

Adjacent to the imaging zone 108 is a radio-frequency coil 114 for manipulating the orientations of magnetic spins within the imaging zone 108 and for receiving radio transmissions from spins also within the imaging zone 108. The radio frequency antenna may contain multiple coil elements. The radio frequency antenna may also be referred to as a channel or antenna. The radio-frequency coil 114 is connected to a radio frequency transceiver 116. The radio-frequency coil 114 and radio frequency transceiver 116 may be replaced by separate transmit and receive coils and a separate transmitter and receiver. It is understood that the radio-frequency coil 114 and the radio frequency transceiver 116 are representative. The radio-frequency coil 114 is intended to also represent a dedicated transmit antenna and a dedicated receive antenna. Likewise the transceiver 116 may also represent a separate transmitter and receivers. The radio-frequency coil 114 may also have multiple receive/transmit elements and the radio frequency transceiver 116 may have multiple receive/transmit channels. For example if a parallel imaging technique such as SENSE is performed, the radio-frequency could 114 will have multiple coil elements.

The transceiver 116 and the gradient controller 112 are shown as being connected to a hardware interface 128 of a computer system 126. The computer system further comprises a processor 130 that is in communication with the hardware system 128, a memory 134, and a user interface 132. The memory 134 may be any combination of memory which is accessible to the processor 130. This may include such things as main memory, cached memory, and also non-volatile memory such as flash RAM, hard drives, or other storage devices. In some examples the memory 130 may be considered to be a non-transitory computer-readable medium.

The computer memory 134 is shown as containing machine-executable instructions 140. The machine-executable instructions contain commands or instructions which enable the processor 130 to control the operation and function of the magnetic resonance imaging system 100. The computer memory 134 is shown as further containing pulse sequence commands 142. The pulse sequence commands 142 are either instructions or data which may be converted into instructions which enable the processor 130 to control the magnetic resonance imaging system 100 to acquire magnetic resonance data. The magnetic resonance data may for instance be used to cause the magnetic resonance imaging system to perform multiple pulse repetitions which cause magnetic resonance signals 144 to be acquired.

Magnetic resonance signals 144 are shown as being stored in the computer memory 134. The magnetic resonance signals 144 for a particular pulse repetition may be collated into the magnetic resonance data 146. The magnetic resonance data 146 may be used to generate a series of intermediate images 148. The intermediate images are acquired and reconstructed in a series which is used to form the magnetic resonance fingerprint for various voxels. The computer memory 134 is shown as containing a magnetic resonance parametric map 150 and a magnetic resonance fingerprinting dictionary 152.

The intermediate images 148 are compared for a particular voxel to the magnetic resonance fingerprinting dictionary 152. This is compared to entries within a magnetic resonance fingerprinting dictionary and a map of various intrinsic properties such as T1, T2 or various concentrations of substances can be inferred. The results of the analysis may be constructed into a two or three-dimensional dataset which is the magnetic resonance parametric map 150. The computer memory 134 is shown as further containing an optional magnetic resonance fingerprinting model 154 which may be used to generate a magnetic resonance fingerprinting dictionary 152 from pulse sequence commands 142. The computer memory 134 also optionally is shown as containing image processing command library 156 which contains commands which enable the processor 130 to perform various image processing operations such as extracting a voxel from the series of intermediate images 148.

The computer memory 134 is shown as containing additionally a B0-off-resonance map 158 that was calculated from groups of magnetic resonance signals 144. The computer memory 134 is further shown as containing chemical shift data 160 that was calculated from the B0-off-resonance map 158. The computer memory 134 is further shown as containing an RF transmit/receive phase map 162 that was also calculated from groups of the magnetic resonance signals 144.

Figure 2:
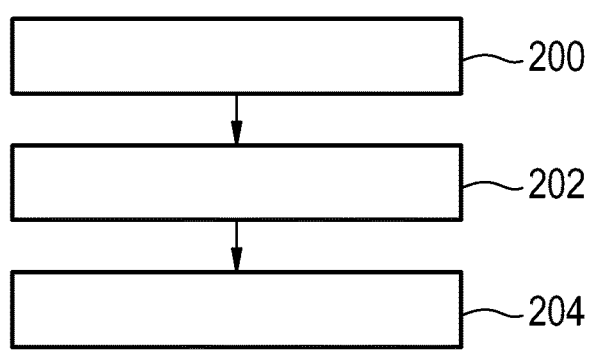
FIG. 2 shows a flow chart with an exemplary method of operating the magnetic resonance imaging system of FIG. 1.

FIG. 2 shows a flowchart which illustrates a method of operating the magnetic resonance imaging system 100 of FIG. 1. First in step 200 the magnetic resonance imaging system is controlled with the pulse sequence commands 142. These cause the magnetic resonance imaging system to acquire the magnetic resonance signals 144 and data 146. The pulse sequence commands 142 are configured for controlling the magnetic resonance imaging system 100 to acquire the magnetic resonance data 146 according to a magnetic resonance fingerprinting protocol. The pulse sequence commands are configured for controlling the magnetic resonance imaging system 100 to acquire the magnetic resonance data 146 during multiple pulse repetitions.

The pulse sequence commands are configured for controlling the magnetic resonance imaging system to cause gradient-induced spin rephasing at least twice during each of the multiple pulse repetitions using the gradient magnetic field generation system 110, 112. The pulse sequence commands are configured for controlling the magnetic resonance imaging system 100 to acquire at least two magnetic resonance signals 144 during each of the multiple pulse repetitions. Each of the at least two magnetic resonance signals is measured during a separate one of the gradient-induced spin rephasings. The magnetic resonance data comprises the at least two magnetic resonance signals 144 acquired during each of the multiple pulse repetitions.

Next in step 202 the B0-off-resonance map 158 is calculated using the magnetic resonance data 146. The B0-off-resonance map 158 is descriptive of a B0-off-resonance magnetic field of the magnetic resonance imaging system 100 when the subject 118 is within the imaging zone 108. The B0-off-resonance map 158 is at least partially calculated using at least two magnetic resonance signals 144 measured during a single pulse repetition. Finally in step 204 at least one magnetic resonance parametric map 150 is generated by comparing the magnetic resonance data 146, which in this case has been transformed into the form of the intermediate images, with the magnetic resonance fingerprinting dictionary 152.

Magnetic Resonance Fingerprinting (MRF) is a new acquisition and reconstruction technique in the field of Magnetic Resonance Imaging (MRI). Instead of acquiring data for a given set of sequence parameters, which results in images with predefined contrast, MRF collects data while varying sequence parameters. The resulting so-called fingerprint is matched with a dictionary of signal evolutions computed in advance assuming characteristic tissue parameters, which results in the simultaneous estimation of said tissue characteristics. MRF has so far been implemented using a balanced gradient-echo (b-SSFP, True-FISP, . . . ) sequence or a gradient-spoiled gradient-echo (N-FFE, FISP, . . . ) sequence.

Using b-SSFP, the B0-off-resonance field in the time-evolution of the spin system is directly modelled in the dictionary computation to account for the well-known banding-artifacts. The second approach, based on gradient-spoiling, overcomes the explicit dependence of the signal magnitude in the dictionary entries on the B0-off-resonance. This greatly reduces the number of dictionary entries and simplifies the matching process. At the same time, however, the information about the B0-off-resonance distribution is no longer directly available, since the signal phase not only contains the B0-off-resonance but also the RF transmit/receive phase.

Examples may allow for the acquisition of data at a range of different echo-times during the fingerprinting sequence. This allows the determination and separation of the B0-off-resonance field and the transmit/receive phase without time-consuming and calculation-intense dictionary matching. In addition, the variation of the signal magnitude between data acquired for different echo-times can be exploited to determine the transverse relaxation time T2* (T2-star). Thus, in combination with T2 from dictionary-matching, the reversible transverse relaxation time $1/T2'=1/T2-1/T2^*$ can be estimated as well.

A feature of some examples is the direct use of the measured signal from MRF, acquired with variable echo-times, to determine the B0-off-resonance field, the transmit/receive phase and/or T2*. This is in contrast to the usual procedure of dictionary matching to determine the physical parameters of the studied system.

In addition, examples may utilize the resulting information to determine the magnetic susceptibility via quantitative susceptibility mapping (QSM), which uses the B0-off-resonance field to determine the electric conductivity via electric properties tomography (EPT), which uses the transmit/receive phase $\phi_{TXRX}$ and possibly determine the transverse relaxation time T2-star from the variation of the signal magnitude as a function of echo-time. Finally, both magnitude and phase of the acquired signals at different echo times and flip angles may be employed to improve the accuracy of MRF-based component matching by including prior knowledge about the chemical shift between different components.

Figure 3:
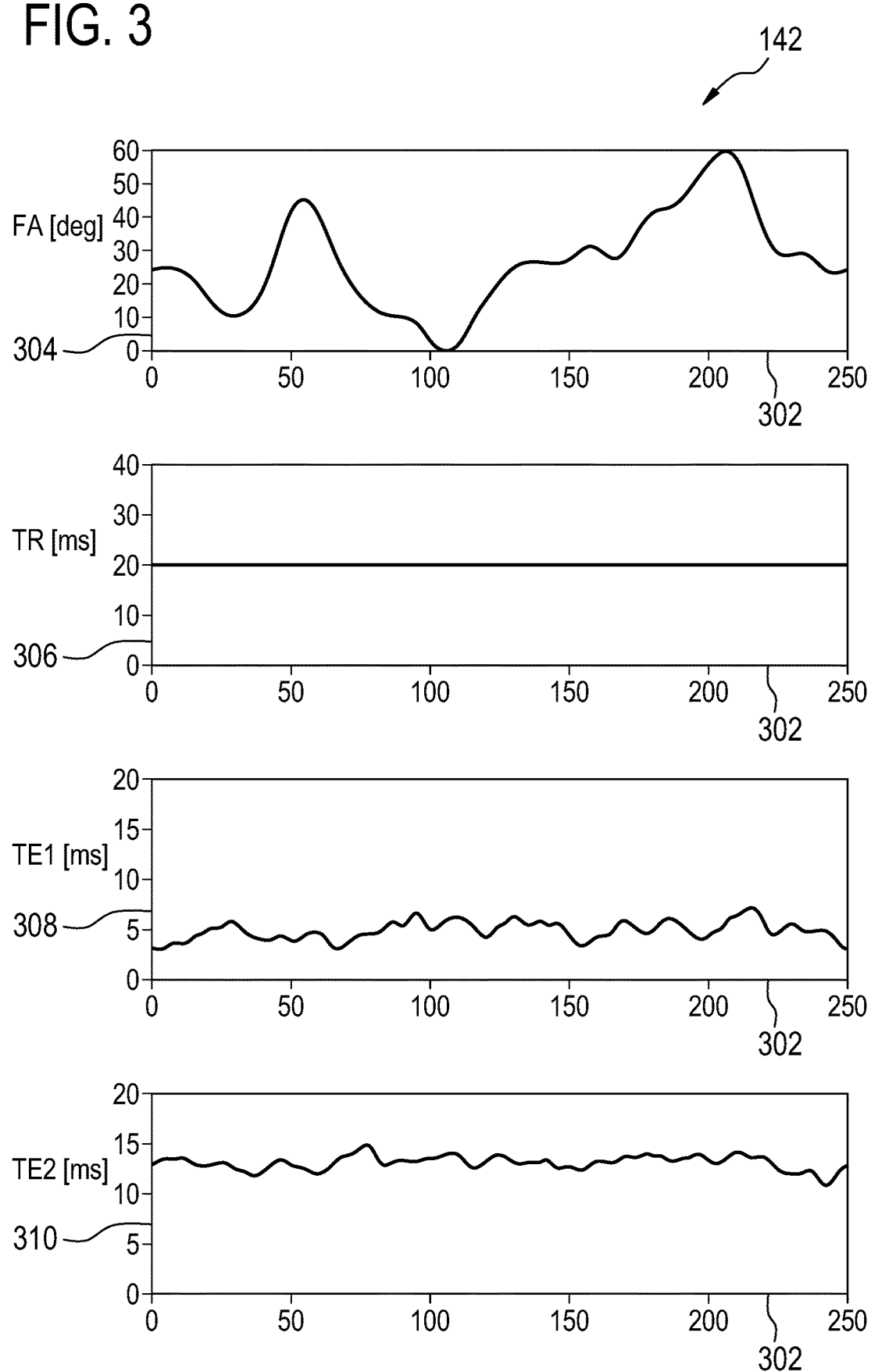
FIG. 3 shows several plots which are used to illustrate some details of pulse sequence commands suitable for performing the method illustrated in FIG. 2.

FIG. 3 illustrates some parameters used in the pulse sequence commands 142. Not all parameters in the pulse sequence commands 142 are illustrated. Of particular note the gradients are not noted and also the temporal position of the RF pulses is not illustrated. There are four plots. The x-axis 302 represents an individual pulse repetition. The plot with the y-axis labeled 304 illustrates the magnitude of the flip angle 304. The plot with the y-axis labeled 306 shows the repetition time of various pulse repetitions 302. In this case the repetition time or TR is kept constant. The plot with the axis labeled 308 shows the time of the first echo. The plot with the y-axis labeled 310 shows the time when the second echo is acquired. The data acquired at the echo times 308 and 310 are the magnetic resonance signals. In this particular example only two are acquired. The pulse sequence will additionally have magnetic field gradients to perform spatial encoding and also to refocus it such that there are gradient echoes at TE1 and TE2. The flip angle 304 is shown as varying nearly smoothly between the different pulse repetitions 302. This may result in better results as there is less variation between adjacent pulse repetitions. This may lead to a more stable answer. However, the use of a pseudo-random or pseudo-random variant flip angle 304 is also possible.

The Magnetic Resonance Fingerprinting (MRF) Acquisition in some examples may proceed by acquiring data after each RF-excitation for a predetermined, arbitrary sequence of flip-angles, repetition times and RF-transmit phase angles, see FIG. 3. Instead of varying only the flip-angle, the (global) RF-transmit phase and the repetition time, the readout module may employ different gradient waveforms to sample the center of k-space at variable times after the RF-pulse.

The echo-time may be determined by the time of gradient-induced spin rephasing, and can be varied by choosing any variant readout-module, e.g., spiral, radial or Cartesian. For example, keeping the repetition-time constant, the echo-time could be chosen to alternate between close to zero and almost TR, by alternating between an outward spiral readout and an inward spiral readout. Alternatively, keeping the readout waveform constant, the echo-time could be varied by simply delaying the start of the readout gradient waveform for a given amount of time. Alternatively, two identical readouts for a single excitation could be used.

Determination of f, $\phi_{TXRX}$, $T^*_2$

The modulation of the complex MR-signal due to varying $T_E$ can be modelled as $$S(T_E) = M_0 \exp\left(-\frac{T_E}{T_2^*}\right) \exp(-i(\phi_{TXRX} + 2\pi f T_E)).$$

Here, $M_0$ contains the effect of all other sequence and tissue parameters for the given fingerprint. The off-resonance field f induces the same phase-shift for any shot during the fingerprint. It can therefore be measured directly from the two complex fingerprinting signals, acquired at different echo-times, for example, by computing the inner-product of the signals:

$$2\pi(TE_2 - TE_1)f = \text{angle}(\Sigma_i \overline{S_i(TE_1)} S_i(TE_2)).$$

Here, it is assumed for the sake of argument that for each combination of sequence parameters in the fingerprinting sequence two signals are acquired that only differ by their $T_E$.

Alternatively, the produced images for each shot of the fingerprinting sequence could be used directly to determine f (the B0-off-resonance magnetic field) and $\phi_{TXRX}$ (RF Transmit/Receive Phase) from the signal phase $\phi(T_E)$=angle $(S(T_E))$ from linear regression using the model $\phi(T_E) = \phi_{TXRX} + 2\pi f T_E$, or any other method described in the literature.

Similarly, T2* (T2-star) can be determined for example using:

$$T_2^* = -\frac{TE_2 - TE_1}{\log\left(\frac{|S(TE_2)|}{|S(TE_1)|}\right)}.$$

Again, other and/or more involved methods using non-linear fitting and/or multiple echo-times can be used when available.

For example, Dictionary-matching as usual in Magnetic Resonance Fingerprinting may be used to determine quantities such as: T1, T2, M0, or etc.

The additional B0-off-resonance information can be employed to improve component matching using MRF. To this end, the chemical shift σ between different components is included in the data analysis. The measured phase for a particular echo time is then given by:

$$\phi(T_E,\alpha) = \phi_{TXRX} + \gamma \Delta B_0^\chi T_E + \psi(T_E,\alpha,\vec{T_1},\vec{T_2},\vec{T^*_2},\vec{\sigma}), (*)$$

where α is the flip angle, $\Delta B\_0^\chi$ is the B0-off-resonance due to susceptibility, and $\vec{T_1}$, $\vec{T_2}$, $\vec{T^*_2}$, and $\vec{\sigma}$ are the tissue properties for the different components. The phase ψ is given by:

$$\psi(T_E, \alpha, \vec{T_1}, \vec{T_2}, \vec{T_2^*}, \vec{\sigma}) = \arg\left(\sum_i w_i s_i(\alpha, T_1^i, T_2^i) e^{i\gamma B_0 \sigma_i T_E} e^{-\frac{T_E}{T_2^i}}\right),$$

where $w_i$ are the fractions of the different components in the voxel. In contrast to the first two terms in eq. (*), the phase ψ exhibits a dependence on the flip angle, which can be used to disentangle the two contributions. Since the chemical shifts between different components are known, they can be included as prior information in the matching procedure. The fractions $w_i$ are then selected to yield the best agreement between measured and simulated signal amplitudes and phases.

Quantitative Susceptibility Mapping (QSM) can be applied to the B0-off-resonance field $\Delta B_0^\chi$ to determine the local tissue magnetic susceptibility (see for example Wang et al.). Briefly, the B0-off-resonance field map is related to the susceptibility distribution χ, by convolution with the dipole-operator D according to $$\Delta B_0^\chi = \frac{\gamma B_0}{2\pi} D \otimes \chi.$$

This defines an ill-posed, ill-conditioned inverse problem, which can be solved employing various regularization techniques described in the literature (see for example Wang et at.).

The electric conductivity σ can be determined using the transmit/receive phase by applying EPT (see for example Voigt et. al.). Briefly, and in its most simple form, the electric conductivity of the tissue at the Larmor frequency can be shown to be determined by the curvature of the transmit-receive phase $\phi_{TXRX}$ ('phase-based EPT') according to $$\sigma = \frac{1}{2\omega\mu_0}\nabla^2 \phi_{TXRX}.$$

Here, $\omega$ is the Larmor frequency, $\mu_0$ is the magnetic permeability and $\nabla^2$ is the Laplace operator.

The combination T2* and T2, determined by dictionary-matching results in an estimate of the reversible component of the transverse relaxation time, defined as $1/T2':=1/T2-1/T2^*$. This parameter has been suggested as a measure of iron content (Haacke 2005).

Figure 4:
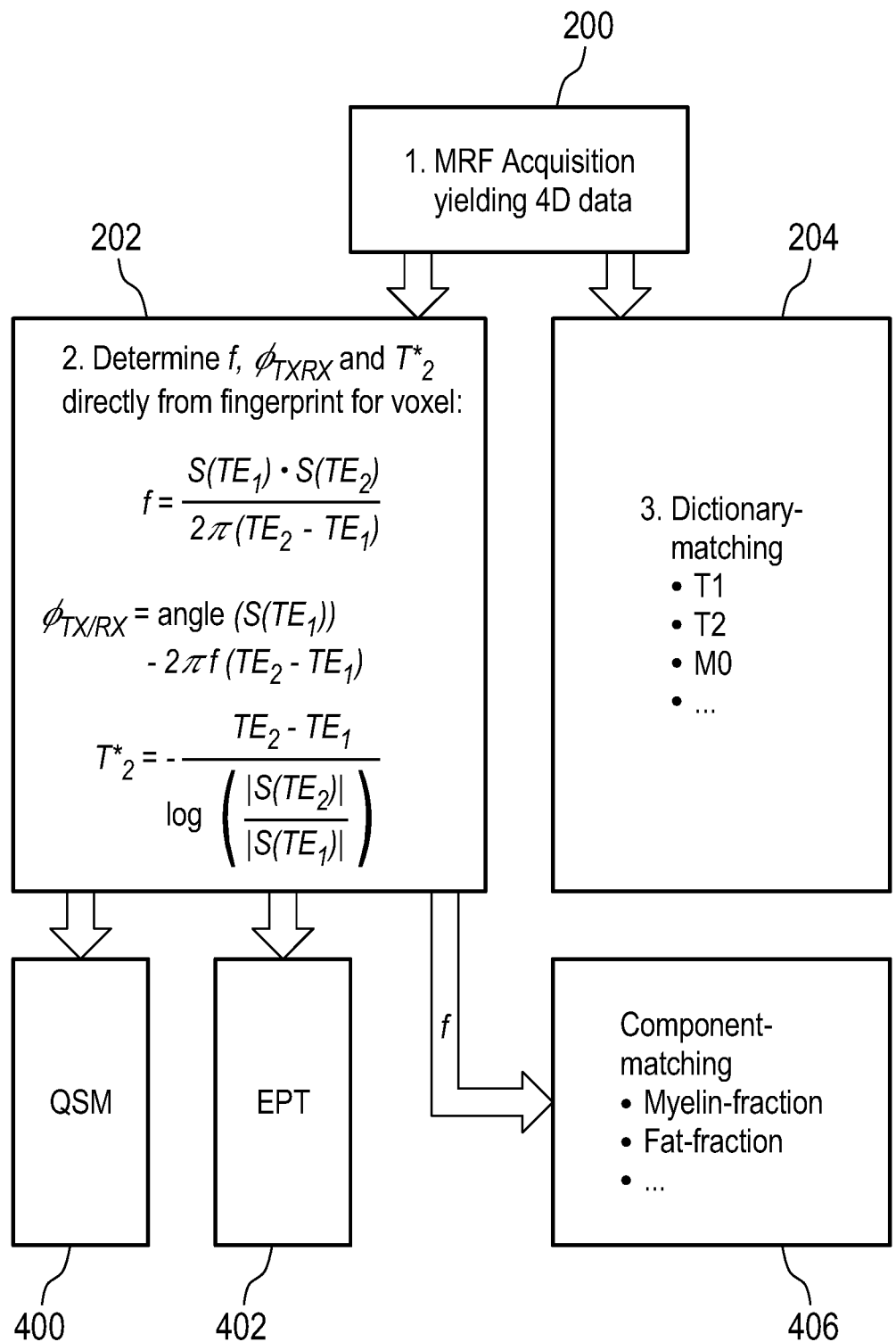
FIG. 4 shows a flow chart which illustrates a method of analyzing magnetic resonance data.

FIG. 4 shows a flowchart which illustrates part of the data acquisition and data analysis. The block labeled 1 and also 200 represents the acquisition of the magnetic resonance fingerprinting data that yields four-dimensional data. The data from step 200 may be processed in several different ways. The method may then proceed to step 202 where the B0-off-resonance map is calculated. During this step additionally the RF transmit/receive phase map and the direct T2-star map may also be calculated. The data from step 200 may also be used to perform a dictionary mapping 204. In the dictionary mapping at least one magnetic resonance parametric map may be calculated. The values determined in step 202 may be used in several different ways. For example the B0-off-resonance map may be used in combination with the dictionary mapping to improve component matching and determine such things as the myelin fraction or the fat fraction in a voxel. The data from step 202 may also be used for performing a further analysis to calculate a quantitative susceptibility map 400 or to perform magnetic resonance electric properties tomography 402. Detectability The production of the additional quantitative maps from the MRF data could be directly visible to the user in a clinical setting. Improved off-resonance-maps, etc. without the need for additional and time-consuming dictionary-matching may accelerate the presentation of results.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

LIST OF REFERENCE NUMERALS 100 magnetic resonance imaging system
104 magnet
106 bore of magnet
108 imaging zone
109 region of interest
110 magnetic field gradient coils
112 magnetic field gradient coil power supply
114 radio-frequency coil
116 transceiver
118 subject
120 subject support
126 computer system
128 hardware interface
130 processor
132 user interface
134 computer memory
140 machine executable instructions
142 pulse sequence commands
144 magnetic resonance signals
146 magnetic resonance data
148 intermediate images
150 magnetic resonance parametric map
152 magnetic resonance fingerprinting dictionary
154 magnetic resonance fingerprinting model
156 image processing command library
158 B0-off-resonance map
160 chemical shift data
162 RF transmit/receive phase map
200 control the magnetic resonance imaging system with the pulse sequence commands to acquire the magnetic resonance data
202 calculate a B0-off-resonance map using the magnetic resonance data, wherein the B0-off-resonance map is descriptive of a B0-off-resonance magnetic field of the magnetic resonance imaging system when the subject is within the imaging zone
204 generate at least one magnetic resonance parametric map by comparing the magnetic resonance data with a magnetic resonance fingerprinting dictionary
300 pulse sequence commands
302 pulse repetitions
304 flip angle [FA]
306 pulse repetition time [TR]
308 echo time 1 [ET1]
310 echo time 2 [ET2]
400 QSM analysis
402 EPT analysis
406 component analysis during MR fingerprinting

The invention claimed is:

1. A magnetic resonance imaging system for acquiring magnetic resonance data from a subject within an imaging zone, the magnetic resonance imaging system comprising:
   a gradient magnetic field generating system configured for generating a gradient magnetic field within the imaging zone;
   a radio-frequency system configured for acquiring the magnetic resonance data;
   a memory for storing machine executable instructions and pulse sequence commands; and
   a processor for controlling the magnetic resonance imaging system, wherein execution of the machine executable instructions and the pulse sequence commands cause the processor to:
      control the magnetic resonance imaging system with the pulse sequence commands to acquire the magnetic resonance data according to a magnetic resonance fingerprinting protocol during multiple pulse repetitions;

control the magnetic resonance imaging system with the pulse sequence commands to cause gradient induced spin rephasing at least twice during each of the multiple pulse repetitions using the gradient magnetic field generating system;

control the magnetic resonance imaging system with the pulse sequence commands to acquire at least two magnetic resonance signals during each of the multiple pulse repetitions, wherein each of the at least two magnetic resonance signals is measured during a separate one of the gradient induced spin rephasing, wherein the magnetic resonance data comprises the at least two magnetic resonance signals acquired during each of the multiple pulse repetitions;

calculate a B0-off-resonance map using the magnetic resonance data, wherein the B0-off-resonance map is descriptive of a B0-off-resonance magnetic field of the magnetic resonance imaging system when the subject is within the imaging zone, wherein the B0-off-resonance map is at least partially calculated using at least two magnetic resonance signals measured during a single pulse repetition;

generate at least one magnetic resonance parametric map by comparing the magnetic resonance data with a magnetic resonance fingerprinting dictionary;

calculate at least one magnetic resonance parametric map using component matching, wherein the component matching is performed at least partially by weighting at least a portion of the magnetic resonance fingerprinting dictionary with chemical shift data, wherein the chemical shift data is calculated at least partially using the B0-off-resonance map.

2. The magnetic resonance imaging system of claim 1, wherein the B0-off-resonance map is calculated at least partially using a complex dot-product of two of the at least two magnetic resonance signals measured during a single pulse repetition.

3. The magnetic resonance imaging system of claim 1, wherein execution of the machine executable instructions further causes the processor to calculate a quantitative susceptibility map using at least partially the B0-off-resonance map.

4. The magnetic resonance imaging system of claim 3, wherein the quantitative susceptibility map is at least partially calculated by solving an inverse problem descriptive of a magnetic susceptibility of the subject.

5. The magnetic resonance imaging system of claim 1, wherein execution of the machine executable instructions further causes the processor to calculate an RF transmit/receive phase map using the magnetic resonance data, wherein the RF transmit/receive phase map is descriptive of a spatially dependent RF transmit/receive phase.

6. The magnetic resonance imaging system of claim 5, wherein execution of the machine executable instructions further causes the processor to calculate magnetic resonance electric properties tomography data using at least partially the RF transmit/receive phase map.

7. The magnetic resonance imaging system of claim 6, wherein the magnetic resonance fingerprinting dictionary is at least partially a function of a transmit B1 magnetic field magnitude, wherein the at least one magnetic resonance parametric map comprises a transmit B1 magnetic field magnitude map, wherein the magnetic resonance electric properties tomography data is calculated at least partially using the transmit B1 magnetic field magnitude map.

8. The magnetic resonance imaging system of claim 1, wherein execution of the machine executable instructions further causes the processor to calculate a direct T2-star map at least partially using the at least two magnetic resonance signals measured during a single pulse repetition.

9. The magnetic resonance imaging system of claim 8, wherein the magnetic resonance fingerprinting dictionary is at least partially a function of T2, wherein the at least one magnetic resonance parametric map comprises a T2 map, and wherein execution of the machine executable instructions further causes the processor to calculate at least partially a T2-prime map from the T2 map and the direct T2-star map.

10. A magnetic resonance imaging system for acquiring magnetic resonance data from a subject within an imaging zone, the magnetic resonance imaging system comprising:
a gradient magnetic filed generating system configured for generating a gradient magnetic field within the imaging zone;
a radio-frequency system configured for acquiring the magnetic resonance data;
a memory for storing machine executable instructions and pulse sequence commands; and
a processor for controlling the magnetic resonance imaging system, wherein execution of the machine executable instructions and the pulse sequence commands cause the processor to;
control the magnetic resonance imaging system with the pulse sequence commands to acquire the magnetic resonance data according to a magnetic resonance fingerprinting protocol during multiple pulse repetitions;
control the magnetic resonance imaging system with the pulse sequence commands to cause gradient induced spin rephasing at least twice during each of the multiple pulse repetitions using the gradient magnetic field generating system;
control the magnetic resonance imaging system with the pulse sequence commands to acquire at least two magnetic resonance signals during each of the multiple pulse repetitions, wherein each of the at least two magnetic resonance signals is measured during a separate one of the gradient induced spin rephasing, wherein the magnetic resonance data comprises the at least two magnetic resonance signals acquired during each of the multiple pulse repetitions;
calculate a B0-off-resonance map using the magnetic resonance data, wherein the B0-off-resonance map is descriptive of a B0-off-resonance magnetic field of the magnetic resonance imaging system when the subject is within the imaging zone, wherein the B0-off-resonance map is at least partially calculated using at least two magnetic resonance signals measured during a single pulse repetition;
generate at least one magnetic resonance parametric map by comparing the magnetic resonance data with a magnetic resonance fingerprinting dictionary, wherein the magnetic resonance fingerprinting dictionary is at least partially a function of T2-star;
calculate a direct T2-star map at least partially using the at least two magnetic resonance signals measured during a single pulse repetition, wherein the at least one magnetic resonance parametric map comprises an encoded T2-star map; and
calculate an extended T2-star map using the direct T2-star map and the encoded T2-star map, wherein the extended T2-star map is calculated by taking values from within a first predetermined range from the direct T2-star map and within a second predetermined range from the encoded T2-star map.

11. A method of operating a magnetic resonance imaging system for acquiring magnetic resonance data from a subject within an imaging zone, wherein the magnetic resonance imaging system comprises: a gradient magnetic field generating system configured for generating a gradient magnetic field within the imaging zone and a radio-frequency system configured for acquiring the magnetic resonance data; wherein the method comprises:
controlling the magnetic resonance imaging system to acquire the magnetic resonance data according to a magnetic resonance fingerprinting protocol during multiple pulse repetitions;
controlling the magnetic resonance imaging system to cause gradient induced spin rephasing at least twice during each of the multiple pulse repetitions using the gradient magnetic field generating system;
controlling the magnetic resonance imaging system to acquire at least two magnetic resonance signals during each of the multiple pulse repetitions, wherein each of the at least two magnetic resonance signals is measured during a separate one of the gradient induced spin rephasing, wherein the magnetic resonance data comprises the at least two magnetic resonance signals acquired during each of the multiple pulse repetitions;
calculating a B0-off-resonance map using the magnetic resonance data, wherein the B0-off-resonance map is descriptive of a B0-off-resonance magnetic field of the magnetic resonance imaging system when the subject is within the imaging zone, wherein the B0-off-resonance map is at least partially calculated using the at least two magnetic resonance signals measured during a single pulse repetition; and
generating at least one magnetic resonance parametric map by comparing the magnetic resonance data with a magnetic resonance fingerprinting dictionary;
calculating chemical shift data using the B0-off-resonance map; and
calculating at least one magnetic resonance parametric map using component matching, wherein the component matching comprises weighting at least a portion of the magnetic resonance fingerprinting dictionary with the chemical shift data.

12. The method of claim 11, wherein the B0-off-resonance map is calculated at least partially using a complex dot-product of two of the at least two magnetic resonance signals measured during a single pulse repetition.

13. A non-transitory computer readable medium comprising machine executable instructions for execution by a processor controlling a magnetic resonance imaging system for acquiring magnetic resonance data from a subject within an imaging zone, wherein the magnetic resonance imaging system comprises:
a gradient magnetic field generating system configured for generating a gradient magnetic field within the imaging zone and a radio-frequency system configured for acquiring the magnetic resonance data;
wherein execution of the machine executable instructions by the processor causes the processor to:
control the magnetic resonance imaging system to acquire the magnetic resonance data according to a magnetic resonance fingerprinting protocol during multiple pulse repetitions;
control the magnetic resonance imaging system to cause gradient induced spin rephasing at least twice during each of the multiple pulse repetitions using the gradient magnetic field generating system;
control the magnetic resonance imaging system to acquire at least two magnetic resonance signals during each of the multiple pulse repetitions, wherein each of the at least two magnetic resonance signals is measured during a separate one of the gradient induced spin rephasing, wherein the magnetic resonance data comprises the at least two magnetic resonance signals acquired during each of the multiple pulse repetitions;
calculate a B0-off-resonance map using the magnetic resonance data, wherein the B0-off-resonance map is descriptive of a B0-off-resonance magnetic field of the magnetic resonance imaging system when the subject is within the imaging zone, wherein the B0-off-resonance map is at least partially calculated using the at least two magnetic resonance signals measured during a single pulse repetition;
generate at least one magnetic resonance parametric map by comparing the magnetic resonance data with a magnetic resonance fingerprinting dictionary; and
calculate at least one magnetic resonance parametric map using component matching, wherein the component matching comprises weighting at least a portion of the magnetic resonance fingerprinting dictionary with chemical shift data, wherein the chemical shift data is calculated at least partially using the B0-off-resonance map.

14. The non-transitory computer readable medium of claim 13, wherein the B0-off-resonance map is calculated at least partially using a complex dot-product of two of the at least two magnetic resonance signals measured during a single pulse repetition.

15. The method of claim 11, further comprising:
calculating a direct T2-star map at least partially using the at least two magnetic resonance signals measured during a single pulse repetition; and
calculating at least partially a T2-prime map from a T2 map and the direct T2-star map, wherein the at least one magnetic resonance parametric map comprises the T2 map.

* * * * *